United States Patent
Yasuda

(10) Patent No.: US 7,898,366 B2
(45) Date of Patent: Mar. 1, 2011

(54) BALANCED ACOUSTIC WAVE FILTER DEVICE AND COMPOSITE FILTER

(75) Inventor: Junpei Yasuda, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/615,368

(22) Filed: Nov. 10, 2009

(65) Prior Publication Data

US 2010/0045399 A1    Feb. 25, 2010

Related U.S. Application Data

(63) Continuation of application No. PCT/JP2008/055260, filed on Mar. 21, 2008.

(30) Foreign Application Priority Data

May 22, 2007    (JP) .................................. 2007-135430

(51) Int. Cl.
H03H 9/64    (2006.01)
(52) U.S. Cl. ......................................... 333/195; 333/133
(58) Field of Classification Search .................. 333/133, 333/193–196; 310/313 B, 313 D
See application file for complete search history.

(56) References Cited

U.S. PATENT DOCUMENTS

| | | | |
|---|---|---|---|
| 2006/0181369 A1 | 8/2006 | Shibahara | |
| 2007/0075804 A1 | 4/2007 | Otsuka | |
| 2007/0103254 A1 | 5/2007 | Haruta et al. | |
| 2009/0261921 A1* | 10/2009 | Moriya et al. | 333/25 |

FOREIGN PATENT DOCUMENTS

| | | |
|---|---|---|
| EP | 1 763 133 A1 | 3/2007 |
| JP | 2006-246145 A | 9/2006 |
| JP | 2007-104052 A | 4/2007 |
| WO | 2006/003787 A1 | 1/2006 |

OTHER PUBLICATIONS

Official Communication issued in International Patent Application No. PCT/JP2008/055260, mailed on May 13, 2008.

* cited by examiner

*Primary Examiner* — Barbara Summons
(74) *Attorney, Agent, or Firm* — Keating & Bennett, LLP

(57) ABSTRACT

An acoustic wave filter device which attains improved balancing between transmission characteristics of first and second balanced terminals includes first and second 3-IDT longitudinally coupled resonator type acoustic wave filter elements that are connected to an unbalanced terminal in parallel, and one terminal of a first IDT and one terminal of a fourth IDT are connected to each other and further connected to the unbalanced terminal, second and third IDTs are connected to each other and further connected to a first balanced terminal, fifth and sixth IDTs are connected to each other and further connected to a second balanced terminal, and a first ground line which electrically connects the second IDT which is nearer to a first ground terminal than the third IDT to the second ground terminal is longer than a second ground line which electrically connects the fifth IDT which is nearer to the first ground terminal than the sixth IDT to the first ground terminal.

16 Claims, 10 Drawing Sheets

BALANCED ACOUSTIC WAVE FILTER DEVICE AND COMPOSITE FILTER

BACKGROUND OF THE INVENTION

1. Field of the Invention

The present invention relates to balanced acoustic wave filter devices having balance-to-unbalance conversion functions, and particularly relates to an acoustic wave filter device in which arrangement of ground lines and ground terminals on a piezoelectric substrate is improved, and a composite filter including the acoustic wave filter.

2. Description of the Related Art

In recent years, general cellular phones have been manufactured to include a plurality of communication systems. Therefore, in order to reduce adverse effects among the communication systems, there is a strong demand for increasing an out-of-band attenuation amount. Furthermore, for miniaturization of cellular phones, a small-sized dual filter chip formed by two filter elements on a piezoelectric substrate has been developed.

As an example of such a dual filter chip, WO2006/003787 described below discloses a balanced acoustic wave filter device including first and second surface acoustic wave filter elements arranged on a piezoelectric substrate.

FIG. 13 is a plan view schematically illustrating a balanced acoustic wave filter device disclosed in WO2006/003787.

A balanced acoustic wave filter device 1001 has an electrode configuration on a piezoelectric substrate 1002 as shown in FIG. 13. In this configuration, first and second surface acoustic wave filters 1011 and 1011A are formed.

The first surface acoustic wave filters 1011 is a balanced acoustic wave filter which includes an unbalanced terminal 1013 and first and second balanced terminals 1014 and 1015 and which has a balanced-to-unbalanced conversion function. The surface acoustic wave filter 1011 has first and second 3-IDT longitudinally-coupled surface acoustic wave filter elements 1017 and 1018 which are connected to the unbalanced terminal 1013 through a single-port surface acoustic wave resonator 1016. The surface acoustic wave filter elements 1017 and 1018 are connected to first and second balanced terminals 1014 and 1015, respectively, through single-port surface acoustic wave resonators 1019 and 1020, respectively.

The second surface acoustic wave filter 1011A is configured similarly to the first surface acoustic wave filter 1011. Therefore, a description of the first surface acoustic wave filter 1011 is used for a description of the second surface acoustic wave filter 1011A by adding a character "A" to reference numerals used for the description of the first surface acoustic wave 1011.

In the acoustic wave filter device having the balanced-unbalanced conversion function, good balancing of signals between first and second balanced terminals 1014A and 1015A is required. Therefore, not only IDT electrodes and electrodes serving as reflectors formed on the piezoelectric substrate 1002 but also terminals to which input signals and ground potentials are supplied and connection lines for wiring are symmetrically arranged with respect to a virtual line passing through the center of the piezoelectric substrate 1002 to the greatest extent possible.

However, as a filter chip is miniaturized, the margin for wiring on the piezoelectric substrate 1002 is reduced.

When the acoustic wave filter device 1001 is manufactured, ground lines and ground terminals are connected to one another at a plurality of portions as much as possible. For example, in FIG. 13, a ground terminal is arranged in a portion indicated by an arrow mark A. This ground terminal is electrically connected to ground terminals of IDTs connected to the balanced terminals 1014 and 1015 of the first surface acoustic wave filter 1011 and terminals connected to ground potentials of IDTs connected to the balanced terminals 1014A and 1015A of the second surface acoustic wave filter 1010. That is, in the first and second surface acoustic wave filters 1011 and 1011A, the terminals to be connected to the ground potentials, the terminals being included in the IDTs connected to the balanced terminals, are connected to one another and further connected to a common ground terminal. In this case, the ground terminal indicated by the arrow mark A is arranged at the center between the first and second surface acoustic wave filters 1011 and 1011A. With this configuration, a symmetric characteristic is improved, and deterioration of balancing is prevented.

However, it becomes apparent that in the conventional acoustic wave filter device 1001 configured as described above, in an attenuation characteristic in the vicinity of pass band in an out-of-band of the first and second surface acoustic wave filters 1011 and 1011A, the balancing is deteriorated.

SUMMARY OF THE INVENTION

In view of the above problems, preferred embodiments of the present invention provide a balanced acoustic wave filter device which has a balance-to-unbalance conversion function and prevents deterioration of balancing between out-of-band attenuation characteristics, and also provide a composite filter including the balanced acoustic wave filter device.

According to a first preferred embodiment of the present invention, a balanced acoustic wave filter device includes an unbalanced terminal and first and second balanced terminals. The balanced acoustic wave filter device includes a piezoelectric substrate, a first longitudinally coupled acoustic wave filter element which is arranged on the piezoelectric substrate, which is connected between the unbalanced terminal and the first balanced terminal, and which includes second, first, and third IDTs arranged in this order in an acoustic wave propagation direction and first and second reflectors arranged so as to sandwich a region including the first to third IDTs in the acoustic wave propagation direction, and a second longitudinally coupled acoustic wave filter element which is arranged on the piezoelectric substrate so as to be spaced away from the first acoustic wave filter element in the acoustic wave propagation direction, which is connected between the unbalanced terminal and the second balanced terminal, and which includes fifth, fourth, and sixth IDTs arranged in this order in the acoustic wave propagation direction and third and fourth reflectors arranged so as to sandwich a region including the fourth to sixth IDTs in the acoustic wave propagation direction. One terminal of the first IDT and one terminal of the fourth IDT are connected to the unbalanced terminal, the other terminal of the first IDT and the other terminal of the fourth IDT are connected to a ground potential, one terminal of the second IDT and one terminal of the third IDT are connected to the first balanced terminal, the other terminal of the second IDT and the other terminal of the third IDT are connected to the ground potential, one terminal of the fifth IDT and one terminal of the sixth IDT are connected to the second balanced terminal, and the other terminal of the fifth IDT and the other terminal of the sixth IDT are connected to the ground potential. On the piezoelectric substrate, a first ground terminal connected to an external ground potential is arranged nearer to the unbalanced terminal relative to the first and second acoustic wave filter elements and nearer to the first acoustic wave filter element relative to the center between the first and second acoustic wave filter elements. A first ground line which connects the terminal, which is connected to the ground potential, of one of the second and third IDTs which is arranged nearer to the first ground terminal to the first ground terminal is longer than a second ground line which connects the terminal, which is connected to the ground potential, of one of the fifth and sixth IDTs which is arranged nearer to the first ground terminal to the first ground terminal.

According to a second preferred embodiment of the present invention, a balanced acoustic wave filter device includes an unbalanced terminal and first and second balanced terminals and a balance-to-unbalance conversion function. The balanced acoustic wave filter device includes a piezoelectric substrate, and first to fourth longitudinally coupled resonator type acoustic wave filter elements arranged on the piezoelectric substrate. Phases of signals output in response to signals input to three of the first to fourth acoustic wave filter elements are the same as one another, and are shifted by 180 degrees with respect to a signal output in response to a signal input to the remaining one of the acoustic wave filter elements. The first longitudinally coupled acoustic wave filter element includes second, first, and third IDTs arranged in this order in an acoustic wave propagation direction and first and second reflectors arranged so as to sandwich a region including the first to third IDTs in the acoustic wave propagation direction. The second longitudinally coupled acoustic wave filter element is arranged on the piezoelectric substrate so as to be spaced away from the first acoustic wave filter element in the acoustic wave propagation direction, and includes fifth, fourth, and sixth IDTs arranged in this order in the acoustic wave propagation direction and third and fourth reflectors arranged so as to sandwich a region including the fourth to sixth IDTs in the acoustic wave propagation direction. One terminal of the first IDT of the first acoustic wave filter element and one terminal of the fourth IDT of the second acoustic wave filter element are connected to each other and further connected to the unbalanced terminal, the first acoustic wave filter element is connected to the first balanced terminal through the third acoustic wave filter element, and the second acoustic wave filter element is connected to the second balanced terminal through the fourth acoustic wave filter element. On the piezoelectric substrate, a first ground terminal connected to an external ground potential is arranged nearer to the unbalanced terminal relative to the first and second acoustic wave filter elements and nearer to the first acoustic wave filter element relative to the center between the first and second acoustic wave filter elements. A first ground line which connects the terminal, which is connected to the ground potential, of one of the second and third IDTs which is arranged nearer to the first ground terminal to the first ground terminal is longer than a second ground line which connects the terminal, which is connected to the ground potential, of one of the fifth and sixth IDTs which is arranged nearer to the first ground terminal to the first ground terminal.

According to a third preferred embodiment of the present invention, a longitudinally coupled resonator type balanced acoustic wave filter device includes a piezoelectric substrate, a first IDT arranged on the piezoelectric substrate, second and third IDTs arranged so as to sandwich the first IDT in an acoustic wave propagation direction, fourth and fifth IDTs arranged so as to sandwich a region including the first to third IDTs in the acoustic wave propagation direction, and first and second reflectors arranged so as to sandwich a region including the first to fifth IDTs in the acoustic wave propagation direction, an unbalanced terminal and first and second balanced terminals, one terminal of the second IDT and one terminal of the third IDT being connected to the unbalanced terminal, and a first divided IDT section and a second divided IDT section obtained by dividing the first IDT in the acoustic wave propagation direction. The first divided IDT section and the fourth IDT are connected to the first balanced terminal, and the second divided IDT section and the fifth IDT are connected to the second balanced terminal. On the piezoelectric substrate, a first ground terminal connected to an external ground potential is arranged nearer to the unbalanced terminal relative to the first to fifth IDTs and nearer to the fourth IDT relative to the center of the first IDT. A first ground line which connects the terminal of the fourth IDT connected to the ground potential to the first ground terminal is longer than a second ground line which connects the second divided IDT section to the first ground terminal.

According to a fourth preferred embodiment of the present invention, a balanced acoustic wave filter device includes an unbalanced terminal and first and second balanced terminals. The balanced acoustic wave filter device includes a piezoelectric substrate, a first longitudinally coupled acoustic wave filter element which is arranged on the piezoelectric substrate, which is connected between the unbalanced terminal and the first balanced terminal, and which includes fourth, second, first, third, and fifth IDTs arranged in this order in an acoustic wave propagation direction and first and second reflectors arranged so as to sandwich a region including the first to fifth IDTs in the acoustic wave propagation direction, and a second longitudinally coupled acoustic wave filter element which is arranged on the piezoelectric substrate so as to be spaced away from the first acoustic wave filter element in the acoustic wave propagation direction or in a direction opposite to the acoustic wave propagation direction, which is connected between the unbalanced terminal and the second balanced terminal, and which includes ninth, seventh, sixth, eighth, and tenth IDTs arranged in this order in the acoustic wave propagation direction and third and fourth reflectors arranged so as to sandwich a region including the sixth to tenth IDTs in the acoustic wave propagation direction. One terminal of the second IDT, one terminal of the third IDT, one terminal of the seventh IDT, and one terminal of the eighth IDT are connected to one another and further connected to the unbalanced terminal, the other terminal of the second IDT, the other terminal of the third IDT, the other terminal of the seventh IDT, the other terminal of the eighth IDT are connected to a ground potential, one terminal of the fourth IDT, one terminal of the first IDT, and one terminal of the fifth IDT are connected to the ground potential, the other terminal of the fourth IDT, the other terminal of the first IDT, and the other terminal of the fifth IDT are connected to the first balanced terminal, one terminal of the ninth IDT, one terminal of the sixth IDT, and one terminal of the tenth IDT are connected to the ground potential, and the other terminal of the ninth IDT, the other terminal of the sixth IDT, and the other terminal of the tenth IDT are connected to the second balanced terminal. On the piezoelectric substrate, a first ground terminal connected to an external ground potential is arranged nearer to the unbalanced terminal relative to the first and second acoustic wave filter elements and nearer to the first acoustic wave filter element relative to the center between the first and second acoustic wave filter elements. A first ground line which connects the terminal of the fourth IDT connected to the ground potential to the first ground terminal is longer than a second ground line which connects the terminal of the ninth IDT connected to the ground potential to the first ground terminal.

That is, the first to fourth preferred embodiments of the present invention are the same in that, in a configuration of a balanced acoustic wave filter device including an unbalanced terminal and first and second balanced terminals arranged on a piezoelectric substrate, a first ground terminal connected to an external ground potential is arranged nearer to the unbalanced terminal relative to IDTs of an acoustic wave filter element and at the center of first and second acoustic wave filter elements or nearer to the first acoustic wave filter element relative to the center among IDTs connected to the first and second balanced terminals or nearer to IDTs connected to the first balanced terminal, a first ground line which connects one of the IDTs which is arranged nearest to the first ground terminal to the first ground terminal, the IDTs being arranged between the unbalanced terminal and the first balanced terminal, is longer than a second ground line which connects a terminal of one of the IDTs which is arranged nearest to the first ground terminal, the terminal of one of the IDTs which are arranged between the unbalanced terminal to the second balanced terminal being connected to the ground potential. Accordingly, grounding is prevented from being intensified in the IDT arranged nearest to the first ground terminal, and a difference between a magnitude of the grounding and a magnitude of grounding at terminals of the IDTs arranged between the unbalanced terminal and the second balanced terminal which are connected to the ground potential is small. Consequently, balancing between out-of-band attenuation characteristics can be improved.

According to a preferred embodiment of the present invention, a second ground terminal which is connected to the terminals of the IDTs connected to the unbalanced terminal, the terminals being to be connected to the ground potential, and which is arranged in a region opposite to a region including the unbalanced terminal relative to the IDTs may preferably be provided.

The composite filter according to another preferred embodiment of the present invention includes the balanced acoustic wave filter device according to one of the above-described preferred embodiments of the present invention. In the composite filter, even when the first ground terminal of the balanced acoustic wave filter device is also used as a ground terminal of another filter chip, balancing between signals is reliably prevented from being deteriorated in the balanced acoustic wave filter device.

According to a preferred embodiment of the present invention, the composite filter may include the balanced acoustic wave filter device and an acoustic wave filter device different from the balanced acoustic wave filter device. The balanced acoustic wave filter device and the other acoustic wave filter device are arranged on the single piezoelectric substrate, and the first ground terminal is shared by the balanced acoustic wave filter device and the other acoustic wave filter device.

As described above, in each of the balanced acoustic wave filter devices of the first and second preferred embodiments of the present invention, since the first ground line which connects the terminal, which is connected to the ground potential, of one of the second and third IDTs which is arranged nearer to the first ground terminal to the first ground terminal is longer than the second ground line which connects the terminal, which is connected to the ground potential, of one of the fifth and sixth IDTs which is arranged nearer to the first ground terminal to the first ground terminal, grounding is prevented from being intensified in one of the second and third IDTs which is arranged nearest to the first ground terminal. Accordingly, the balancing between signals of the first and second balanced terminals can be improved. Although a reason why the balancing of signals is improved by arranging the first ground line longer than the second ground line is not necessarily clear, it is believed that this is because an adverse effect of a direct wave transmitted to the first ground terminal from the first IDT connected to the unbalanced terminal is prevented.

Similarly, in the third and fourth preferred embodiments of the present invention, since the first ground line is longer than the second ground line, grounding in the IDTs connected to the first ground line weakens. Accordingly, also in the third and fourth preferred embodiments of the present invention, the balancing between signals of the first and second balanced terminals can be enhanced.

Accordingly, in a case where the acoustic wave filter device according to a preferred embodiment of the present invention is used, even when the first ground terminal is arranged so as to be shifted from the center of the filter element, the balancing between signals is prevented from being deteriorated. Therefore, the first ground terminal is also used as a ground terminal of another adjacent filter chip without deterioration of the balancing between signals. Consequently, miniaturization of the composite filter device, for example, can be enhanced.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

The present invention will be described hereinafter with reference to preferred embodiments of the present invention and the accompanying drawings.

Figure 1:
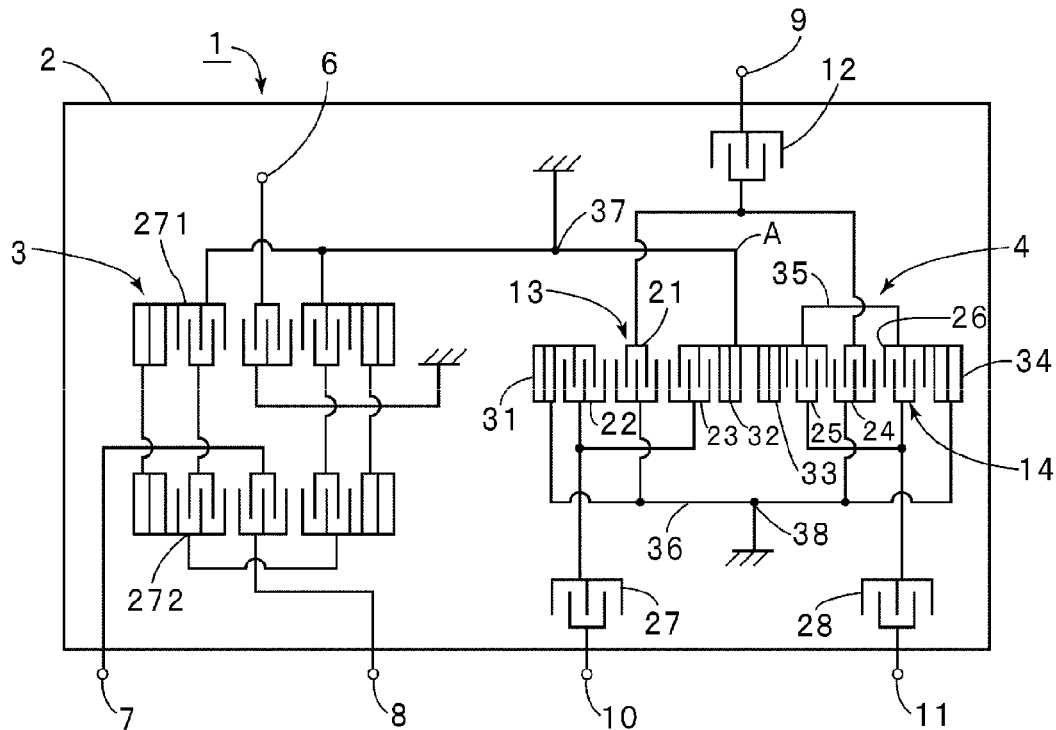
FIG. 1 is a plan view schematically illustrating a composite filter according to a first preferred embodiment of the present invention.

FIG. 1 is a plan view schematically illustrating a composite filter including an acoustic wave filter device according to a preferred embodiment of the present invention. The composite filter of this preferred embodiment is a surface acoustic wave device configured such that an EGSM reception filter and a PCS reception filter are disposed on a piezoelectric substrate 2.

By forming an electrode configuration on the piezoelectric substrate 2 as shown in FIG. 1, an EGSM reception filter 3 and a PCS reception filter 4 each of which preferably has a balance-to-unbalance conversion function are provided. The EGSM reception filter 3 includes an unbalanced terminal 6 and first and second balanced terminals 7 and 8. Similarly, the PCS reception filter 4 includes an unbalanced terminal 9 and first and second balanced terminals 10 and 11. The impedance on the unbalanced terminals 6 and 9 side preferably is about 50Ω and the impedance on the first and second balanced terminals 7, 8, 10, and 11 side preferably is about 100Ω.

Each of the reception filters 3 and 4 preferably is a surface acoustic wave filter having the electrode configuration as shown in FIG. 1. That is, each of the reception filters 3 and 4 preferably is a surface acoustic wave filter having a balance-to-unbalance conversion function and an impedance conversion function.

In a composite filter 1 including the reception filters 3 and 4 of this preferred embodiment, the PCS reception filter 4 corresponds to a balanced acoustic wave filter device according to a preferred embodiment of the present invention.

The PCS reception filter 4 includes a single-port surface acoustic wave resonator 12 connected to the unbalanced terminal 9. First and second 3-IDT acoustic wave filter elements 13 and 14 are connected to the unbalanced terminal 9 through the single-port surface acoustic wave resonator 12. The first and second 3-IDT acoustic wave filter elements 13 and 14 are 3-IDT longitudinally-coupled surface acoustic wave filters.

The first acoustic wave filter element 13 includes a first IDT 21 and second and third IDTs 22 and 23 which are arranged so as to sandwich the first IDT 21 in a surface acoustic wave propagation direction. That is, the second IDT 22, the first IDT 21, and the third IDT 23 are arranged in this order in the surface acoustic wave propagation direction. First and second reflectors 31 and 32 are arranged in a surface wave propagation direction so as to sandwich a region in which the IDTs 21 to 23 are arranged.

On the other hand, the second acoustic wave filter element 14 includes a fifth IDT 25, a fourth IDT 24, and a sixth IDT 26 arranged in this order in a surface acoustic wave propagation direction. Third and fourth reflectors 33 and 34 are arranged in a surface wave propagation direction so as to sandwich a region in which the IDTs 24 to 26 are arranged. The second acoustic wave filter element 14 is arranged so as to be spaced away from the first acoustic wave filter element 13 in the surface acoustic wave propagation direction.

The acoustic wave propagation direction of the first acoustic wave filter element 13 and the acoustic wave propagation direction of the second acoustic wave filter element 14 are the same as each other or opposite to each other.

The first IDT 21 of the first acoustic wave filter element 13 has one terminal connected to the unbalanced terminal 9 through the single-port surface acoustic wave resonator 12, and the other terminal connected to the ground potential. The second and third IDTs 22 and 23 each have terminals connected to the ground potential, and the other terminals connected to each other and further connected to a first balanced terminal 10 through a surface acoustic wave resonator 27. Similarly, in the second acoustic wave filter element 14, the fourth center IDT 24 has one terminal connected to the unbalanced terminal 9 through the single-port surface acoustic wave resonator 12. On the other hand, the fifth and sixth IDT 25 and 26 each have terminals connected to the ground potential, and other terminals connected to each other and further connected to a second balanced terminal 11 through the surface acoustic wave resonator 28.

When these electrodes are formed on the piezoelectric substrate 2, portions to be connected to the ground potential are connected to one another by ground lines. Here, a first ground wiring section 35 is arranged nearer to the unbalanced terminal 9 relative to a region in which the acoustic wave filter elements 13 and 14 are arranged. Furthermore, a second ground wiring section 36 is arranged nearer to the balanced terminals 10 and 11 relative to the region in which the acoustic wave filter elements 13 and 14 are arranged. The first ground wiring section 35 is connected to a first ground terminal 37, and the second ground wiring section 36 is connected to a second ground terminal 38. The first and second ground terminals 37 and 38 are external terminals electrically connected to portions connected to a ground terminal outside of the composite filter 1.

On the piezoelectric substrate 2, the first ground terminal 37 is arranged nearer to the unbalanced terminal 9 relative to the first and second acoustic wave filter elements 13 and 14 and nearer to the first acoustic wave filter element 13 relative to the center between the first and second acoustic wave filter elements 13 and 14. This is because the first ground terminal 37 is also connected to the ground potential of the EGSM reception filter 3 adjacent to the PCS reception filter 4 which is the acoustic wave filter device of the present preferred embodiment. That is, the first ground terminal 37 is arranged between the two reception filters 3 and 4. By arranging the first ground terminal 37 connected to the external ground potential between the two reception filters 3 and 4, and by sharing the ground terminal by the reception filters 3 and 4, miniaturization of the entire acoustic wave filter device is attained.

On the other hand, in this preferred embodiment, the terminals of the first and fourth IDTs 21 and 24, the IDTs 21 and 24 being to be connected to the unbalanced terminal 9, which are to be connected to the ground potential, are connected to each other by the second ground wiring section 36 and further electrically connected to the second ground terminal 38.

As is apparent from FIG. 1, the terminals of the second and third IDTs 22 and 23 which are connected to the first IDT 10 are connected to the ground potential through the second ground wiring section 36.

One of the unique features of the present preferred embodiment is that a length of a first ground line which connects the first ground terminal 37 to the second IDT 22 which is arranged nearer to the first ground terminal 37 relative to the third IDT 23 is larger than a length of a second ground line which connects the first ground terminal 37 to the terminal of the fifth IDT 25 which is arranged nearer to the first ground terminal 37 relative to the sixth IDT 26, the terminal being connected to the ground potential. With this arrangement, the out-of-band attenuation characteristic is improved. The reason for this is described in more detail below.

Note that in the following description, the characteristics of the present preferred embodiment will be described by comparing the present preferred embodiment with a comparative example shown in FIG. 2 in which portions different from the present preferred embodiment are denoted by reference numerals including a character "A".

Figure 2:
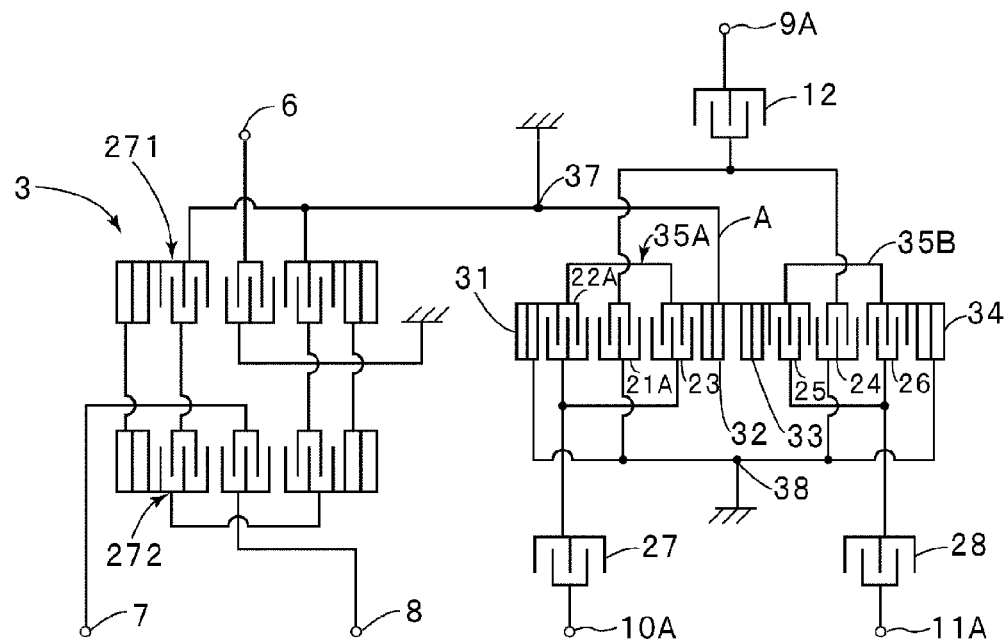
FIG. 2 is a plan view schematically illustrating a composite filter for a comparison with the composite filter according to the first preferred embodiment of the present invention.

In a composite filter of the comparative example shown in FIG. 2, second IDTs 22A and 23 are arranged so as to sandwich a first IDT 21, and one terminal of the second IDT 22A is connected to a first balanced terminal 10A, and the other terminal is connected to a ground potential. The terminal of the IDT to be connected to the ground potential is connected to one terminal of the IDT 23 to be connected to the ground potential through a ground line 35A, and further connected to a ground line A which connects a reflector 32 to a first ground terminal 37. On the other hand, terminals of fifth and sixth IDTs 25 and 26 which are to be connected to the ground potential are connected to each other through a ground line 35B, and the fifth IDT 25 is also connected to the ground line A. Accordingly, in the comparative example, although the IDT 22A is arranged nearest to the first ground terminal 37, a length of a ground line from the terminal of the first IDT 22A which is to be connected to the ground potential to the first ground terminal 37 is slightly smaller than a length of a ground line which connects the terminal of the fifth IDT 25 which is to be connected to the ground potential to the first ground terminal 37. In a case where one end of the ground line A is connected to the center between reflectors 32 and 33, these ground lines preferably have substantially the same lengths.

As described above, in general, the ground line which connects the second IDT 22A to the first ground terminal 37 and the ground line which connects the fifth IDT 25 to the first ground terminal 37 are conventionally devised to have lengths as small as possible.

However, in the configuration shown in FIG. 2, it became apparent that excellent balancing between a signal output from the first balanced terminal 10A which is connected to the first IDT 22A and a signal output from a second balanced terminal 11A is not attained. This may be because a direct wave from the first IDT 21A connected to an unbalanced terminal 9A is supplied to the first ground terminal 37 connected to the external ground potential.

On the other hand, in this preferred embodiment, as shown in FIG. 1, the second IDT 22 is arranged nearest to the first ground terminal 37, and one of the terminals of the second IDT 22 to be connected to the ground potential is connected to the second ground wiring section 36 through the first reflector 31. Accordingly, the first ground line connects the terminal of the second IDT 22 to be connected to the ground potential to the first ground terminal 37 such that the first ground line extends through the first reflector 31, the second ground wiring section 36, the reflector 34, the first ground wiring section 35, and the ground line A to the first ground terminal 37. On the other hand, the second ground line which connects the terminal of the fifth IDT 25 to be connected to the ground potential to the first ground terminal 37 has a length including a length of a portion of a bus bar ranging from the terminal of the fifth IDT 25 to the terminal of the second reflector 32 and the ground line A. Accordingly, since the first ground line is sufficiently longer than the second ground line, the grounding is prevented from being excessively intensified in the IDT 22. In other words, the grounding of the IDT 22 weakens, and therefore, influence due to the direct wave transmitted from the first IDT 21 to the first ground terminal 37 is reduced in the second IDT 22. Accordingly, balancing between a signal output from the first IDT 10 and a signal output from the second balanced terminal 11 is improved.

Accordingly, in the composite filter 1, although the first ground terminal 37 is arranged at a portion shifted from the center of the PCS reception filter 4 so as to be shared by the reception filter 4 and the reception filter 3 adjacent to the reception filter 4, the balancing of signals in the PCS reception filter 4 can be enhanced. Therefore, the balancing between signals is not deteriorated and miniaturization of the composite filter 1 is attained.

Figure 3A:
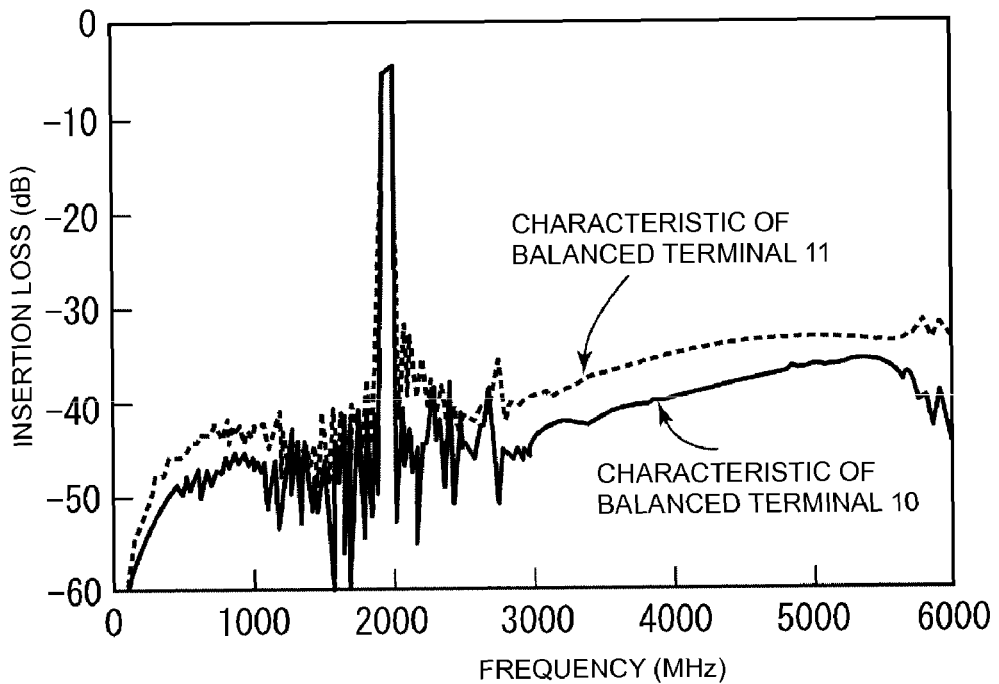
FIG. 3A is a diagram illustrating a characteristic of attenuation amount frequencies of first and second balanced terminals.
Figure 3B:
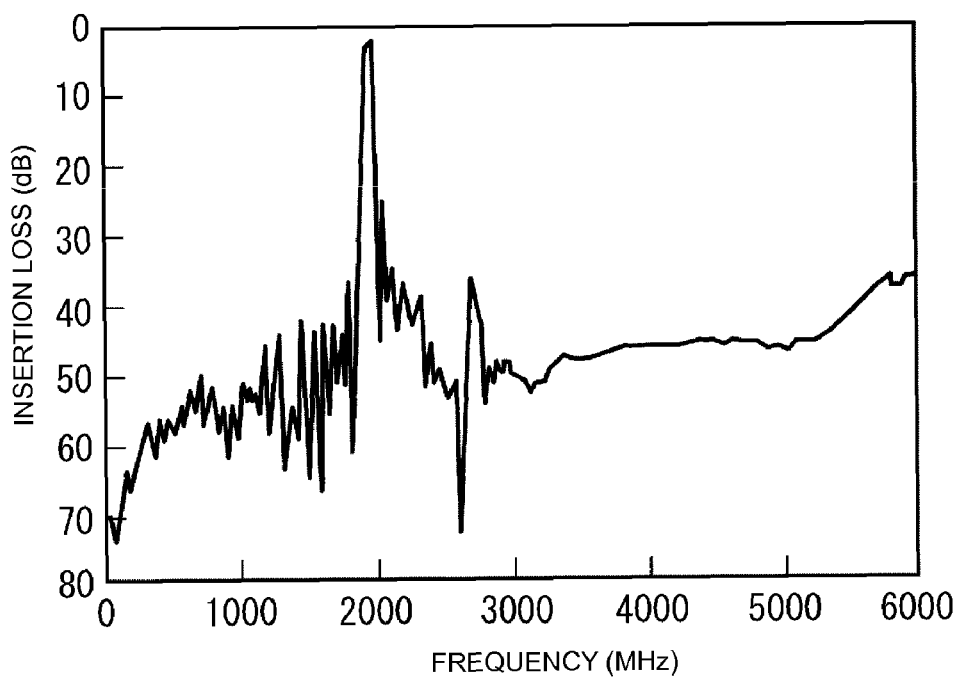
FIG. 3B is a diagram illustrating a difference between characteristics of the first and second balanced terminals.

FIG. 3A is a diagram illustrating insertion losses of the first and second balanced terminals 10 and 11 of the PCS reception filter 4 of the composite filter 1 according to the preferred embodiment, and FIG. 3B is a diagram illustrating a differential characteristic between the insertion losses of the first and second balanced terminals.

Figure 4A:
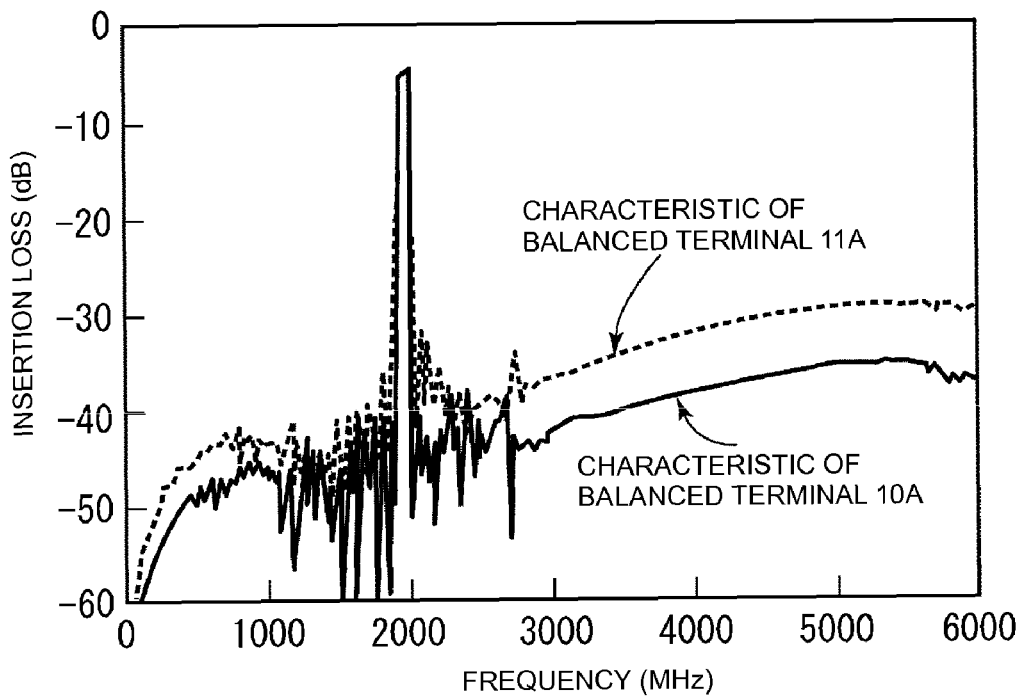
FIG. 4A illustrates a characteristic of the relationship between an attenuation amount and a frequency of a first balanced terminal and a characteristic of the relationship between an attenuation amount and a frequency of a second balanced terminal in the comparative example shown in FIG. 2.
Figure 4B:
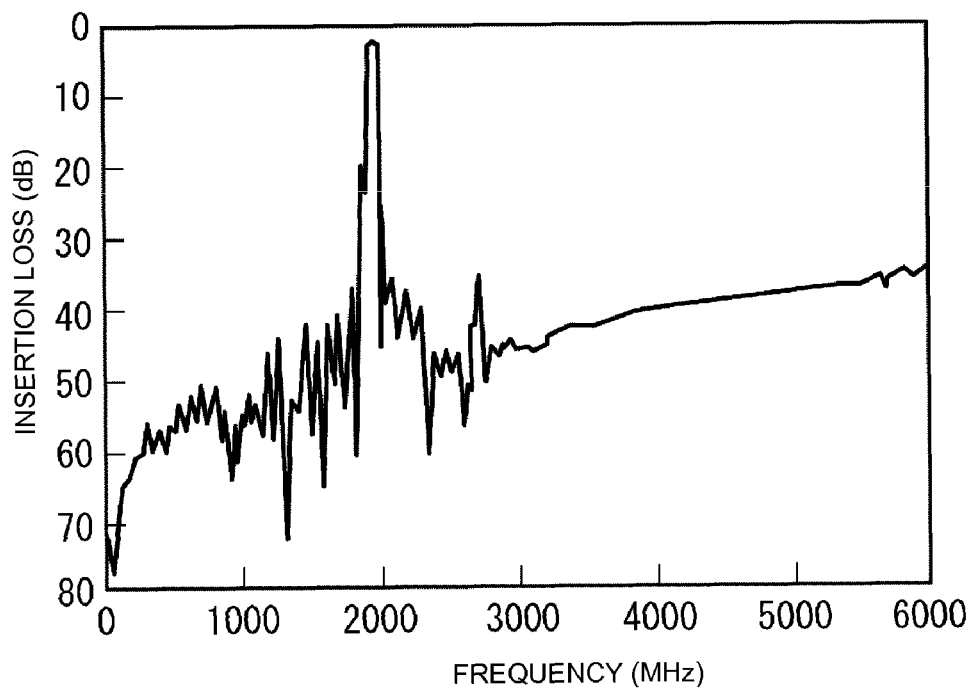
FIG. 4B is a diagram illustrating a difference between characteristics of the first and second balanced terminals.

FIG. 4A illustrates insertion losses of the first and second balanced terminals 10A and 11A of the comparative example shown in FIG. 2, and FIG. 4B is a diagram illustrating a differential characteristic between the insertion losses.

As is apparent from FIGS. 4A and 4B, a difference between an attenuation amount of the balanced terminal 10A and an attenuation amount of the balanced terminal 11A in the vicinity of 5 GHz is approximately 7 dB. Therefore, in the differential characteristic shown in FIG. 4B, an attenuation characteristic on a high frequency side is deteriorated.

On the other hand, as shown in FIG. 3A, in this preferred embodiment, the attenuation characteristic of the second balanced terminal 11 is improved by approximately 5 dB in the vicinity of 5 GHz. The attenuation characteristic of the first balanced terminal 10 is the same as that of the comparative example. Therefore, a difference between the attenuation amount of the first balanced terminal 10 and the attenuation amount of the second balanced terminal 11 in the vicinity of 5 GHz is reduced to approximately 3 dB. Accordingly, in the differential characteristic shown in FIG. 3B, a sufficiently high attenuation amount is attained on the high frequency side.

Figure 5:
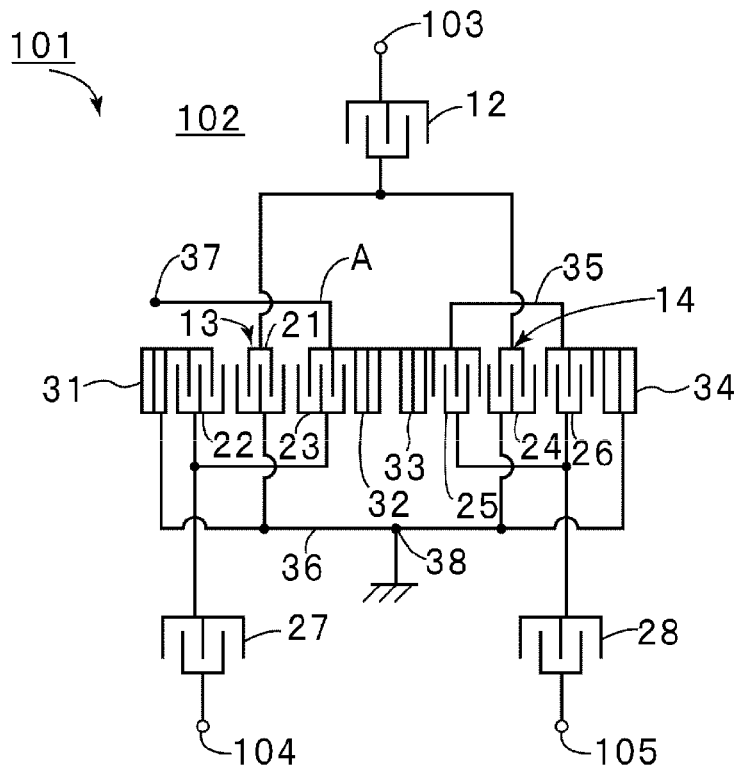
FIG. 5 is a plan view schematically illustrating an electrode configuration of an acoustic wave filter device according to a second preferred embodiment of the present invention.
Figure 6:
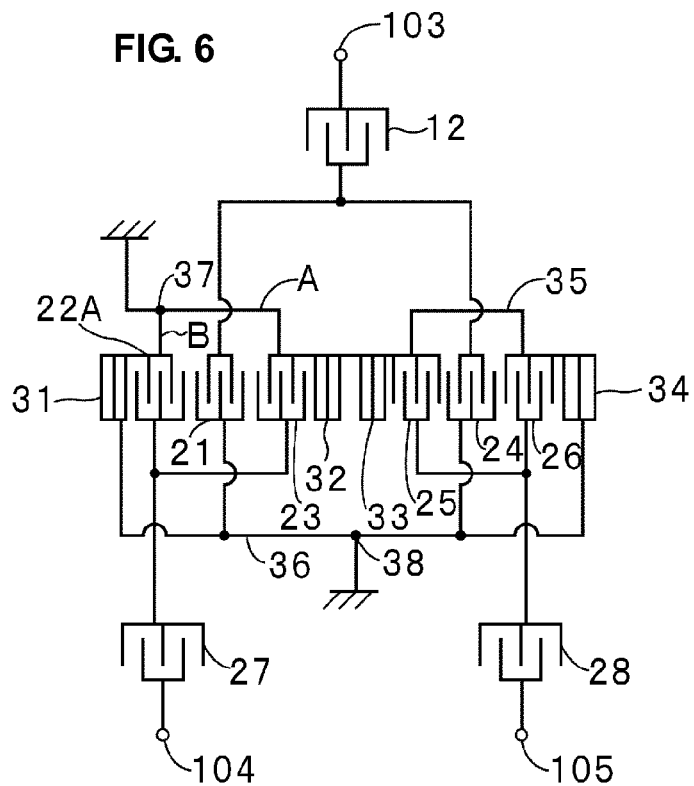
FIG. 6 is a plan view schematically illustrating an electrode configuration of a conventional acoustic wave filter device for a comparison of the acoustic wave filter device of the second preferred embodiment of the present invention.

FIG. 5 is a plan view schematically illustrating an electrode configuration of an acoustic wave filter device according to a second preferred embodiment of the present invention. FIG. 6 is a plan view schematically illustrating an electrode configuration of a conventional acoustic wave filter device according to a second comparative example provided for comparison with the second preferred embodiment.

In an acoustic wave filter device 101 according to the second preferred embodiment, an electrode configuration as shown in FIG. 5 is formed on a piezoelectric substrate 102 whereby a PCS reception filter is configured. That is, similarly to the PCS reception filter 4 included in the composite filter 1 of the first preferred embodiment, the acoustic wave filter device 101 is a reception band filter for a cellular phone using a PCS method.

The acoustic wave filter device 101 includes an unbalanced terminal 103 and first and second balanced terminals 104 and 105. Impedance on the unbalanced terminal 103 side preferably is about 50Ω, and impedance on the first and second balanced terminals 104 and 105 side preferably is about 150Ω, for example.

Accordingly, the acoustic wave filter device 101 is also an acoustic wave filter device having an impedance conversion function and a balance-to-unbalance conversion function.

The acoustic wave filter device 101 of this preferred embodiment is basically the same as the PCS reception filter 4 which is the acoustic wave filter according to the first preferred embodiment. That is, the unbalanced terminal 103 corresponds to the unbalanced terminal 9 of the first preferred embodiment, and the first and second balanced terminals 104 and 105 correspond to the first and second balanced terminals 10 and 11 of the first preferred embodiment, respectively. Then, the electrode configuration the same as that of the PCS reception filter 4 according to the first preferred embodiment is connected between the unbalanced terminal 103 and the first and second balanced terminals 104 and 105. Therefore, components that are the same as those of the first preferred embodiment are denoted by reference numerals the same as those of the first preferred embodiment, and the description of the first preferred embodiment is quoted.

This preferred embodiment also includes a first ground terminal 37 connected to an external ground potential and a second ground terminal 38 connected to the external ground potential. The first ground terminal 37 is arranged nearer to the unbalanced terminal 103 relative to first and second acoustic wave filter elements 13 and 14 and near the first acoustic wave filter element 13. One terminal of a second IDT 22 to be connected to a ground potential is, similarly to the first preferred embodiment, connected to a ground wiring section 36 through a first reflector 31. The second ground terminal 38 is connected to the second ground wiring section 36. The ground wiring section 36 is connected to one terminal of a reflector 34. The other terminal of the reflector 34 is shared with a bus bar of an IDT 26, and is connected to one terminal of the IDT 25 connected to the ground potential using a first ground wiring section 35. Furthermore, one terminal of a third IDT 23, one terminal of a reflector 32, one terminal of a reflector 33, and the terminal of the IDT 25 which are to be connected to the ground potential are connected to one another to be a common ground terminal. One terminal of a ground wiring section A is connected to the common ground terminal, and the other terminal of the ground wiring section A is connected to the first ground terminal 37. The second ground wiring section 36 is arranged nearer to the first and second balanced terminals 104 and 105 relative to the first and second acoustic wave filter elements 13 and 14.

Also in this preferred embodiment, a first ground line is longer than a second ground line. That is, in this preferred embodiment, the first ground line extends from one terminal of the IDT 22 through the first reflector 31, the second ground wiring section 36, the reflector 34, the bus bar shared by the reflector 34 and the sixth IDT 26, the first ground wiring section 35, the fifth IDT 25, a bus bar shared by the reflectors 32 and 33, and the ground wiring section A to the first ground terminal 37. On the other hand, the second ground line extends from the terminal of the IDT 25 through a bus bar shared by terminals of the reflectors 32 and 33 and the ground wiring section A to the first ground terminal 37. Accordingly, also in this preferred embodiment, the first ground line is longer than the second ground line. Accordingly, as with the first preferred embodiment, balancing can be improved in the second preferred embodiment.

Note that the second comparative example shown in FIG. 6 has a configuration substantially the same as the comparative example shown in FIG. 2. Therefore, the same components are denoted by the same reference numerals, and descriptions thereof are omitted. In the second comparative example, one terminal of a second IDT 22A to be connected to a ground potential is directly connected to a first ground terminal 37 through a ground wiring section B. Other configurations are the same as those of the second preferred embodiment. Accordingly, in the second comparative example, the second IDT 22A connected to a first balanced terminal 104 and IDTs 24, 25, and 26 connected to a second balanced terminal 105 are connected to one another through first ground wiring sections 35A and 35, and further connected to the first ground terminal 37.

The acoustic wave filter device according to the second preferred embodiment of the present invention or the second comparative example is configured on a single piezoelectric substrate. Accordingly, instead of the second ground terminal 38 shown in FIGS. 1 and 2, the first ground terminal 37 which is not shared by adjacent elements is preferably used, and the first ground terminal 37 is connected to the ground potential. Other configurations of the acoustic wave filter device 101 according to the second preferred embodiment are the same as those of the PCS reception filter 4 according to the first preferred embodiment. Therefore, as with the first preferred embodiment, balancing between out-of-band attenuation characteristics can be improved.

As described above, according to various preferred embodiments of the present invention, only the acoustic wave filter device 101 configured in accordance with the present invention, instead of a composite filter, may be formed on a single piezoelectric substrate.

Figure 7:
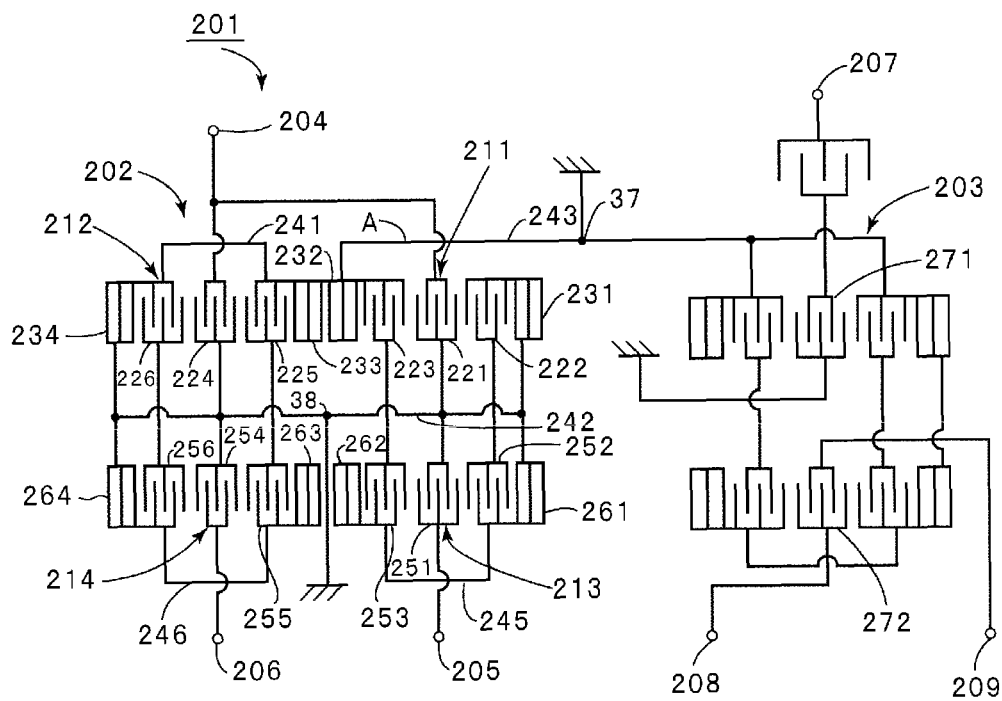
FIG. 7 is a plan view schematically illustrating an electrode configuration of a composite filter according to a third preferred embodiment of the present invention.

FIG. 7 is a plan view schematically illustrating an electrode configuration of a composite filter 201 according to a third preferred embodiment of the present invention. In the composite filter 201, the electrode configuration is arranged on a piezoelectric substrate as shown in FIG. 7.

In the composite filter 201 of the third preferred embodiment, according to the electrode configuration, surface acoustic wave filter devices 202 and 203 are provided on the piezoelectric substrate.

The surface acoustic wave filter device 202 is a transmission filter using a CDMA 2100 method and the surface acoustic wave filter device 203 is a transmission filter using a CDMA 800 method.

Note that between the surface acoustic wave filter devices 202 and 203, the surface acoustic wave filter device 202 which is the transmission filter using the CDMA 2100 method is a surface acoustic wave filter device according to the present preferred embodiment of the present invention.

As shown in FIG. 7, the surface acoustic wave filter device 202 includes an unbalanced terminal 204 and first and second balanced terminals 205 and 206. The surface acoustic wave filter device 203 which is the transmission filter using the CDMA 800 method includes an unbalanced terminal 207 and first and second balanced terminals 208 and 209.

In the surface acoustic wave filter device 202, first to fourth filter elements 211 to 214 are connected between the unbalanced terminal 204 and the first and second balanced terminals 205 and 206.

Specifically, one terminal of the first filter element 211 and one terminal of the second filter element 212 are connected to the unbalanced terminal 204. The first filter element 211 includes a first IDT 221 and second and third IDT 222 and 223 which are arranged so as to sandwich the first IDT 221 in a surface wave propagation direction. That is, the second IDT 222, the first IDT 221, and the third IDT 23 are arranged in the surface wave propagation direction in this order. First and second reflectors 231 and 232 are arranged so as to sandwich a region in which the IDTs 221 to 223 are arranged in a surface wave propagation direction.

Similarly, in the second filter element 212, a fifth IDT 225, a fourth IDT 224, and a sixth IDT 226 are arranged in this order in a surface wave propagation direction, and third and fourth reflectors 233 and 234 are arranged so as to sandwich a region in which the IDTs 224 to 226 are arranged in a surface wave propagation direction. Here, one terminal of the first IDT 221 of the first filter element 211 and one terminal of the fourth IDT 224 of the second filter element 212 are connected to the unbalanced terminal 204 in common.

The other terminal of the first IDT 221 and the other terminal of the fourth IDT 224 are connected to a second ground wiring section 242.

First and second ground terminals 37 and 38 are connected to a ground potential outside of the composite filter 201. The second IDT 222 is nearer to the first ground terminal 37 than the third IDT 223. One terminal of the second IDT 222 to be connected to the ground terminal is connected to the second ground wiring section 242 through the first reflector 231. Note that the second ground terminal 38 is connected to the second ground wiring section 242.

Furthermore, one terminal of the third IDT 223, one terminal of the fifth IDT 225, one terminal of the first reflector 231, and one terminal of the reflector 233 are connected to one another and further connected to a first ground wiring section 241. One terminal of the sixth IDT 226 is also connected to the first ground wiring section 241.

The terminal of the sixth IDT 226 to be connected to the ground potential is connected to one terminal of the fourth reflector 234, and the other terminal of the fourth reflector 234 is connected to the second ground wiring section 242. Therefore, the first ground wiring section 241 is connected to the second ground wiring section 242 through the fourth reflector 234.

Note that the terminal of the third IDT 223, the terminal of the second reflector 232, the terminal of the third reflector 233, and the terminal of the fifth IDT 225 which are to be connected to the ground potential are configured as a common terminal and the common terminal is electrically connected to the first ground terminal 37 through a ground wiring section A. The first ground terminal 37 is arranged nearer to the unbalanced terminal 204 relative to the first and second filter elements 211 and the 212 and near the first filter element 211 relative to the center between the first and second filter elements 211 and the 212. The second IDT 222 is arranged nearer to the first ground terminal 37 than the IDT 223. The terminal of the second IDT 222 to be connected to the ground terminal is connected to the first ground terminal 37 through a first ground line. Note that the first ground line extends from the terminal of the second IDT 222 to be connected to the ground potential and includes the first reflector 231, the second ground wiring section 242, the fourth reflector 234, the first ground wiring section 241, and the ground wiring section A.

On the other hand, a second ground line of this preferred embodiment connects the fifth IDT 225 which is arranged nearer to the first ground terminal 37 than the sixth IDT 226 to the first ground terminal 37. Specifically, the second ground line starting from the terminal of the IDT 225 is connected to the first ground terminal 37 through the ground wiring section A. Accordingly, also in this preferred embodiment, the first ground line is longer than the second ground line.

Note that the first ground terminal 37 also corresponds to a ground terminal used to electrically connect the surface acoustic wave filter device 203 to the outside. Therefore, the first ground terminal 37 is arranged nearer to the first filter element 211 relative to the center of the surface acoustic wave filter device 202.

In subsequent stages of the first and second filter elements 211 and 212, third and fourth filter elements 213 and 214 are connected.

Specifically, the other terminal of the first IDT 221 of the first filter element 211 is connected to one terminal of a first IDT 251 of the third acoustic wave filter element 213, and the other terminal of the first IDT 251 of the third filter element 213 is connected to the first balanced terminal 205. Furthermore, the other terminal of the second IDT 222 and the other terminal of the third IDT 223 are electrically connected to one terminal of a second IDT 252 and one terminal of a third IDT 253 of the third filter element 213, respectively. The other terminal of the IDT 252 and the other terminal of the IDT 253 are connected to each other through a ground line 245, and the terminal of the second IDT 252 is electrically connected to a first reflector 261. The first reflector 261 is electrically connected to the second ground wiring section 242. Accordingly, the terminals of the IDTs 252 and 253 to be connected to the ground potential are electrically connected to the second ground wiring section 242 through the first reflector 261.

Note that one terminal of a second reflector 262 is electrically connected to the terminal of the third IDT 253 to be connected to the ground potential.

Similarly to the second filter element 212, the fourth filter element 214 includes fourth to sixth IDTs 254 to 256 and third and fourth reflectors 263 and 264. One terminal of the fourth IDT 254 is electrically connected to the second ground wiring section 242. The other terminal of the fourth IDT 254 is connected to the second balanced terminal 206. One terminal of the fifth IDT 255 and one terminal of the sixth IDT 256 are electrically connected to the other terminal of the fifth IDT 225 and the other terminal of the sixth IDT 226, respectively. The other terminal of the fifth IDT 255 and the other terminal of the sixth IDT 256 are electrically connected to each other through a fourth ground line 246.

The terminal of the sixth IDT 256 to be connected to the ground potential is electrically connected to the fourth reflector 264, and the fourth reflector 264 is electrically connected to the second ground wiring section 242. Accordingly, the terminals of the first and sixth IDTs 255 and 256 which are to be connected to the ground potential are electrically connected to the second ground wiring section 242 through the fourth reflector 264.

Also in this preferred embodiment, in the surface acoustic wave filter device 202 having a balance-to-unbalance conversion function described above, the terminal of the second IDT 222 of the first filter element 211 which is to be connected to the ground potential and which is arranged near the first balanced terminal 205 is connected to the first ground terminal 37 through a unique line which is different from a line corresponding to portions of the third IDT 223 connected to the first balanced terminal 205 and the IDT 225 and 226 connected to the second balanced terminal 206 which are connected to the ground potential.

Also in this preferred embodiment, as described above, since the first ground line is longer than the second ground line, a difference between an out-of-band attenuation characteristic of the first balanced terminal 205 and an out-of-band attenuation characteristic of the second balanced terminal 206 is reduced, and accordingly, balancing between the out-of-band attenuation characteristics is enhanced.

Note that the surface acoustic wave filter device 203 is configured such that a fifth 3-IDT longitudinally coupled resonator type surface acoustic wave filter device 271 and a sixth longitudinally coupled resonator type surface acoustic wave filter element 272 are connected to each other in series between the unbalanced terminal 207 and the first and second balanced terminals 208 and 209.

Figure 8:
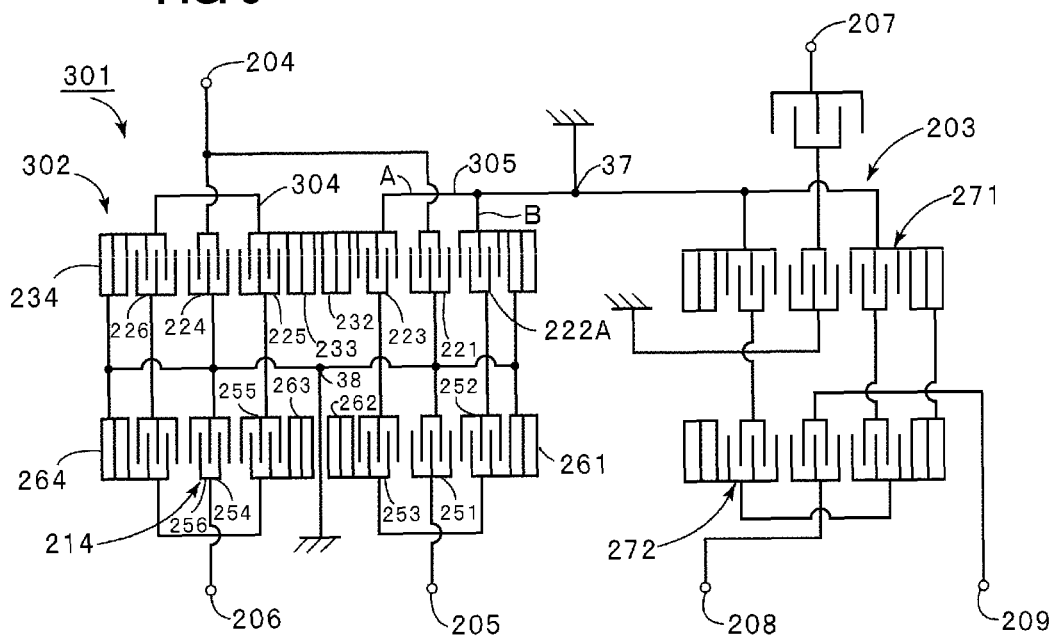
FIG. 8 is a plan view schematically illustrating an electrode configuration of a conventional composite filter for a comparison with the composite filter of the third preferred embodiment of the present invention.

FIG. 8 is a plan view schematically illustrating an electrode configuration of a conventional composite filter 301 as an example of comparison with that of the third preferred embodiment. The composite filter 301 includes a surface acoustic wave filter device 302 and a surface acoustic wave filter device 203. The surface acoustic wave filter device 203 is the same as that of the third preferred embodiment.

The surface acoustic wave filter device 302 is the same as that of the third preferred embodiment except that one terminal of a second IDT 222A to be connected to a ground potential is directly connected to a first ground terminal 37 through a ground wiring section B. Since the second IDT 222A of a first filter element which is nearest to the first ground terminal 37 is connected to a connection point of a ground wiring section A through the ground wiring section B, a first ground line which connects the IDT 222A to the first ground terminal 37 is shorter than a second ground line which connects an IDT 225 to the first ground terminal 37. Therefore, an out-of-band attenuation characteristic of a first balanced terminal 205 is different from an out-of-band attenuation characteristic of a second balanced terminal 206, and accordingly, balancing may be deteriorated. On the other hand, in the third preferred embodiment, as with the first and second preferred embodiments, the balancing between the out-of-band attenuation characteristics can be improved.

Figure 9:
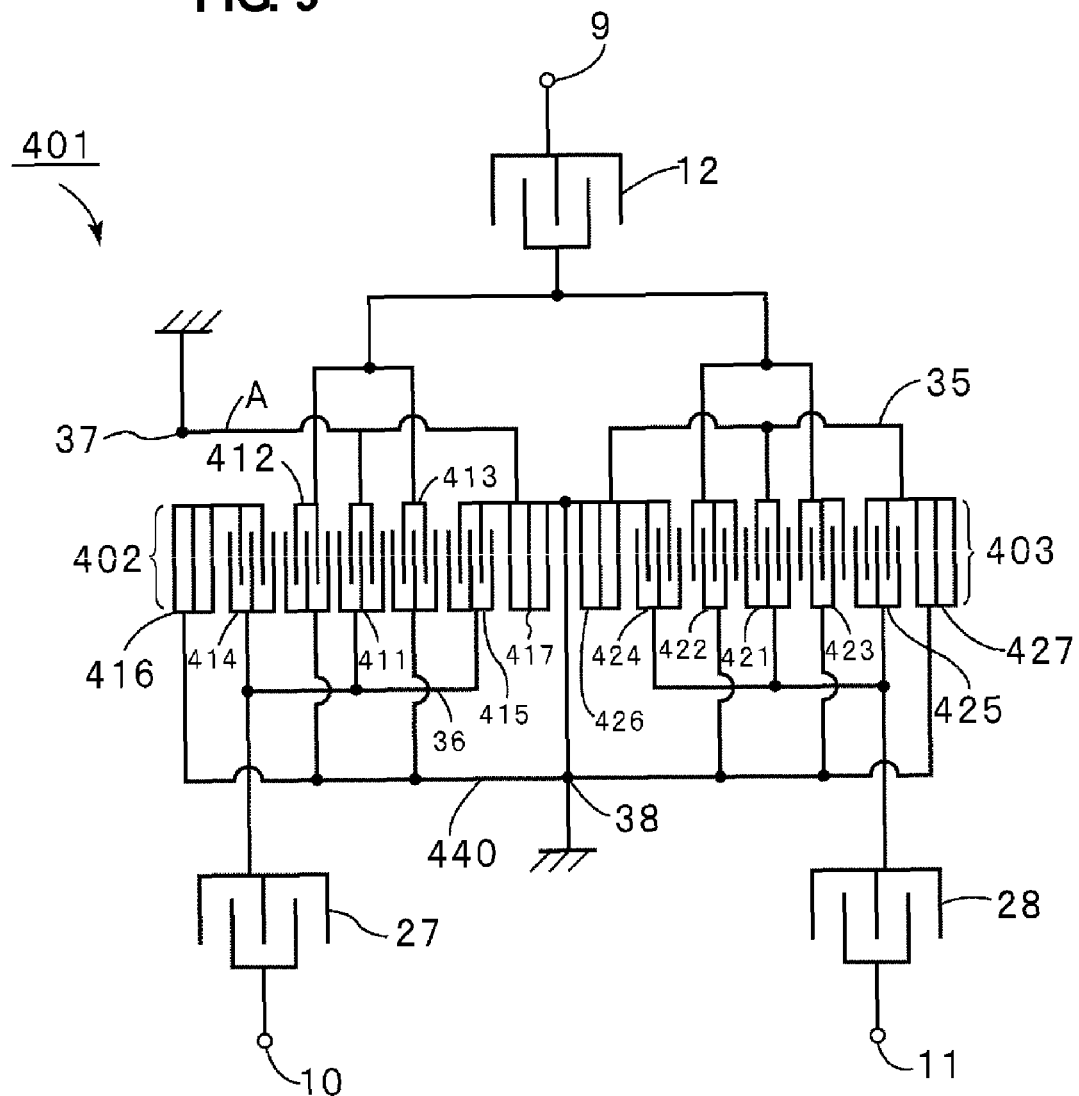
FIG. 9 is a plan view schematically illustrating an electrode configuration of an acoustic wave filter element according to a fourth preferred embodiment of the present invention.

According to the first to third preferred embodiments, examples in which 3-IDT longitudinally coupled resonator type surface acoustic wave filter devices are included are described. However, the present invention is applicable to a configuration using a 5-IDT longitudinally coupled acoustic wave filter element. Specifically, an acoustic wave filter device 401 according to a fourth preferred embodiment shown in FIG. 9 is the same as the reception filter 4 shown in FIG. 1 except that the acoustic wave filter device 401 includes first and second 5-IDT acoustic wave filter elements 402 and 403. Accordingly, the same components are denoted by the same reference numerals, and descriptions thereof are omitted. Here, the first acoustic wave filter element 402 includes a fourth IDT 414, a second IDT 412, a first IDT 411, a third IDT 413, and a fifth IDT 415 in this order in a surface acoustic wave propagation direction. The second acoustic wave filter element 403 includes a ninth IDT 424, a seventh IDT 422, a sixth IDT 421, an eighth IDT 423, and a tenth IDT 425 in this order in a surface acoustic wave propagation direction.

In the first acoustic wave filter element 402, one terminal of the second IDT 412 and one terminal of the third IDT 413 are connected to each other, and further connected to an unbalanced terminal 9. The other terminal of the second IDT 412 and the other terminal of the third IDT 413 are electrically connected to a ground wiring section 440. Furthermore, one terminal of the first IDT 411, one terminal of the fourth IDT 414, and one terminal of the fifth IDT 415 are connected to one another and further connected to a first balanced terminal 10 through a surface acoustic wave resonator 27. The other terminal of the IDT 411 and the other terminal of the fifth IDT 415 are connected to the first ground terminal 37 through the ground wiring section A arranged near the unbalanced terminal 9. Furthermore, the fifth IDT 415 is electrically connected to a reflector 417. A reflector 414 and the reflector 417 are electrically connected to the ground wiring section 440.

Among the IDTs connected to the first balanced terminal 10, the other terminal of the fourth IDT 414 which is arranged nearest to the first ground terminal 37, the terminal being the one to be connected to the ground potential, is not connected to the ground wiring section A, but connected to a first reflector 416.

On the other hand, in the second acoustic wave filter element 403, the terminals of the seventh and eighth IDTs 422 and 423 connected to the ground potential, the seventh and eighth IDTs 422 and 423 being connected to the unbalance terminal 9, are connected to the ground line section 440.

On the other hand, the terminals of the sixth IDT 421, the ninth IDT 424, and the tenth IDT 425 which are to be connected to the ground potential are connected to one another through a ground wiring section 35. The first ground wiring section 35 is also connected to reflectors 426 and 427. The reflector 426 is connected to the reflector 417, and the reflector 427 is electrically connected to the ground wiring section 440.

In this preferred embodiment, a first ground line electrically connects the terminal of the fourth IDT 414 which is arranged nearest to the first ground terminal 37, among the IDTs 411, 414, and 415, the terminal being to be connected to the ground potential, to the first ground terminal 37. The first line extends from the terminal of the fourth IDT 414 to be connected to the ground potential to the first ground terminal 37 through the reflector 416, the ground wiring section 440, the reflector 403, the first ground wiring section 35, and the ground wiring section A. On the other hand, a second ground line connects the IDT 424 which is arranged nearest to the first ground terminal 37, among the IDTs of the second acoustic wave filter element 403 which are connected to the second balanced terminal 11 to the first ground terminal 37. The second ground line extends from the terminal of the IDT 424 to the first ground terminal 37 through the reflectors 426 and 417 which are connected to the IDT 424 and the ground line A. Also in this preferred embodiment, the first ground terminal 37 is arranged nearer to the unbalanced terminal 9 relative to the first and second acoustic wave filter elements 402 and 403 and arranged nearer to the first acoustic wave filter element 402 relative to the center between the first and second filter elements 402 and 403.

Also in this preferred embodiment, the first ground line is longer than the second ground line. Accordingly, a difference between a grounding state on the balanced terminal 10 side and a grounding state on the balanced terminal 11 is small whereby balancing between out-of-band attenuation amounts is improved.

Figure 10:
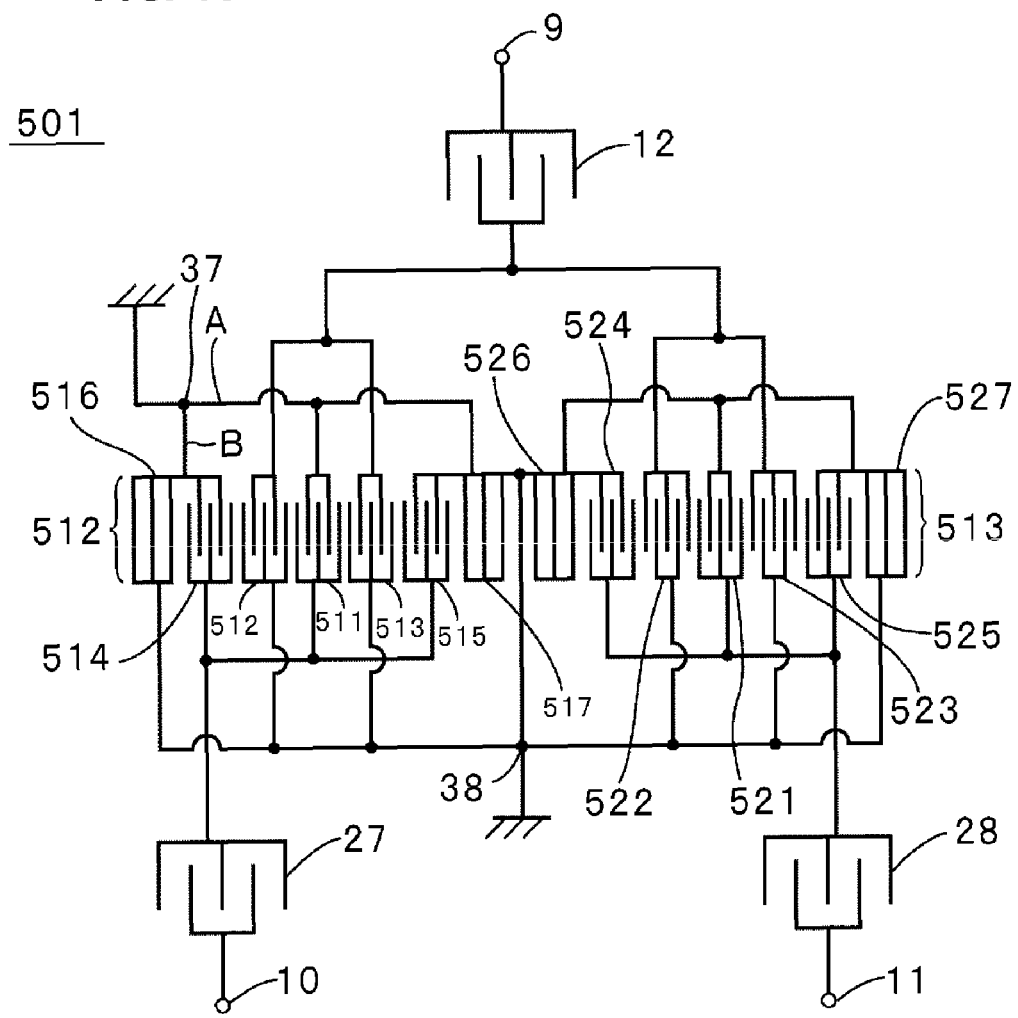
FIG. 10 is a plan view schematically illustrating an electrode configuration of an acoustic wave filter device for a comparison with the acoustic wave filter element of the fourth preferred embodiment of the present invention.

Note that FIG. 10 is a plan view schematically illustrating an electrode configuration of a conventional example corresponding to the acoustic wave filter device 401 of the third preferred embodiment for reference. In a composite filter 501, one terminal of a fourth IDT 514 to be connected to a ground potential, among first to fifth IDTs 511 to 515 of a first acoustic wave filter element 502, is connected through ground wiring sections A and B to one terminal of the IDT 511 and one terminal of the IDT 515 which are to be connected to the ground potential, the IDTs 511, 514, and 515 being to be connected to a first balanced terminal 10. Accordingly, in the conventional example, a first ground line is shorter than a second ground line. Therefore, in first and second acoustic wave filters 512 and 513, a difference between a grounding state on the balanced terminal 10 side and a grounding state on the balanced terminal 11 is comparatively large. Accordingly, balancing between out-of-band attenuation amounts may be deteriorated. Similarly, a second acoustic wave filter 513 includes first to fifth IDTs 521 to 525 and reflectors 526 and 527. Furthermore, the first acoustic wave filter 512 includes first and second reflectors 516 and 517.

Figure 11:
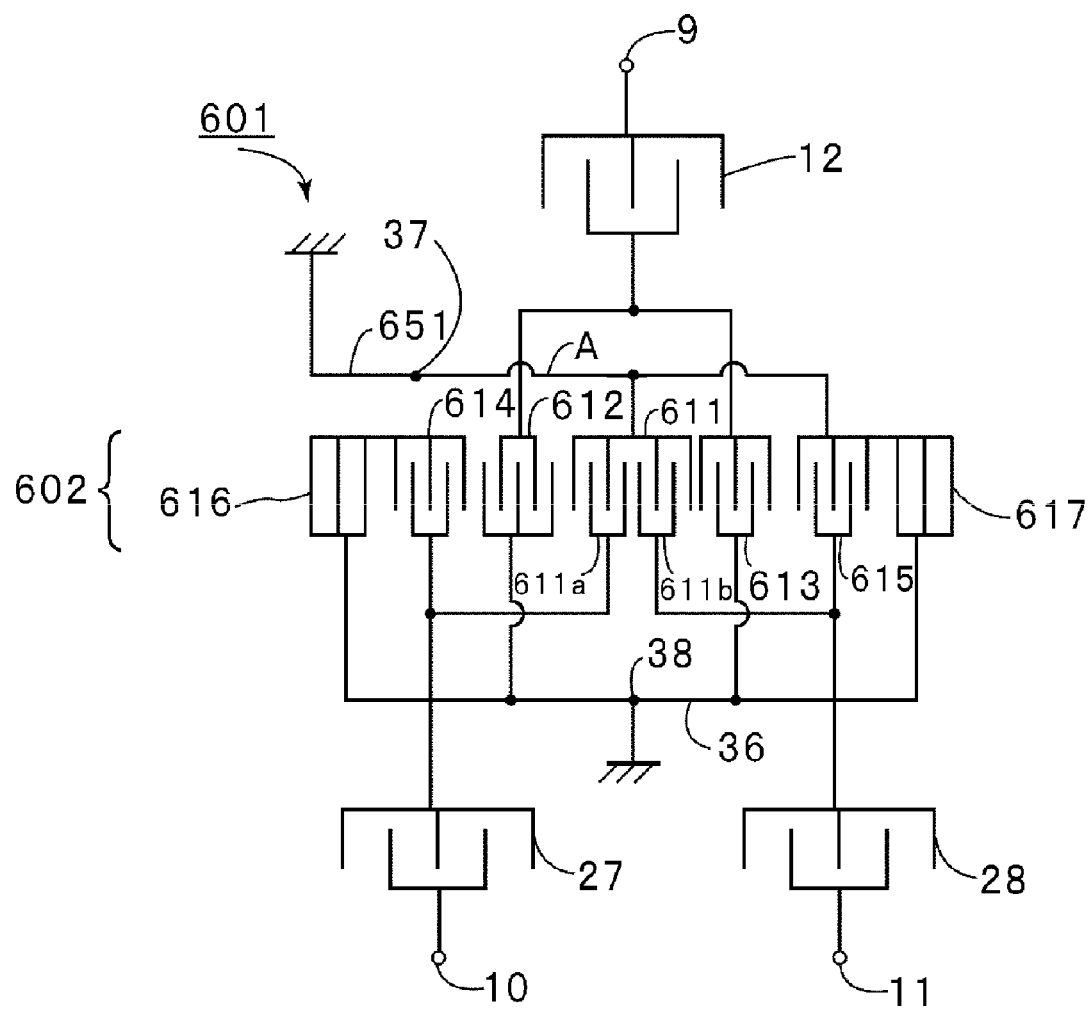
FIG. 11 is a plan view schematically illustrating an electrode configuration of an acoustic wave filter device according to a fifth preferred embodiment of the present invention.

FIG. 11 is a plan view schematically illustrating an electrode configuration of an acoustic wave filter element according to a fifth preferred embodiment of the present invention. In an acoustic wave filter device 601 of the fifth preferred embodiment, a 5-IDT longitudinally coupled resonator type acoustic wave filter element 602 is arranged between an unbalanced terminal 9 and first and second balanced terminals 10 and 11.

The acoustic wave filter element 602 includes a first IDT 611, second and third IDTs 612 and 613 which are arranged so as to sandwich the first IDT 611 in a surface wave propagation direction, and fourth and fifth IDTs 614 and 615 which are arranged so as to sandwich a region including the first to third IDTs 611 to 613 in the surface wave propagation direction. First and second reflectors 616 and 617 are arranged so as to sandwich a region including the first to fifth IDTs 611 to 615 in a surface wave propagation direction. One terminal of the IDT 614 to be connected to a ground potential is electrically connected to one terminal of the first reflector 616. Similarly, one terminal of the fifth IDT 615 to be connected to the ground potential is electrically connected to one terminal of the reflector 617.

One terminal of the second IDT 612 and one terminal of the third IDT 613 are connected to the unbalance terminal 9 in common through a single-port surface acoustic wave resonator 12. The other terminal of the second IDT 612 and the other terminal of the third IDT 613 are electrically connected to a second ground wiring section 36.

On the other hand, the first IDT 611 which is connected to the balanced terminals is divided into a first divided IDT 611*a* and a second divided IDT 611*b* in a surface wave propagation direction. The first divided IDT section 611*a* included in the first IDT 611 and one terminal of the fourth IDT 614 are connected to each other, and are further connected to the second balanced terminal 11 through an one-port surface acoustic wave resonator 27. The second divided IDT section 611*b* and one terminal of the fifth IDT 615 are connected to each other, and are further connected to the second balanced terminal 11 through an one-port surface acoustic wave resonator 28.

One terminal of the first IDT 611 to be connected to the ground potential and the other terminal of the fifth IDT 615 to be connected to the ground potential are electrically connected to a ground wiring section A. In addition to the ground wiring section A arranged near the unbalanced terminal 9, the second ground wiring section 36 is arranged nearer to the first and second balanced terminals 10 and 11 relative to the 5-IDT acoustic wave filter element. The terminal of the IDT 612 and the terminal of the IDT 613 which are to be connected to the ground potential, the IDTs 612 and 613 being connected to the unbalanced terminal 9, are connected to the second ground wiring section 36. Furthermore, the reflectors 616 and 617 are also connected to the second ground wiring section 36. As described above, since the reflector 616 is electrically connected to the terminal of the fourth IDT 614 to be connected to the ground potential, the terminal of the fourth IDT 614 to be connected to the ground potential is electrically connected to the ground wiring section 36.

In this preferred embodiment, the first ground terminal 37 is arranged nearer to the unbalanced terminal 9 relative to a region including the first to fifth IDTs 611 to 615, and arranged nearer to the fourth IDT 614 relative to the center among the first to fifth IDTs 611 to 615. The fourth IDT 614, between the first divided IDT section 611*a* and the fourth IDT 614, which is arranged nearest to the first ground terminal 37 is connected to the first ground terminal 37 through a first ground line. Note that the first ground line extends from the terminal of the IDT 614 to be connected to the ground potential to the first ground terminal 37 through the resonator 616, the ground wiring section 36, the reflector 617, a bus bar shared by the reflector 617 and the IDT 615, and the ground wiring section A.

On the other hand, in this preferred embodiment, a second ground line extends from the terminal of the second divided IDT 611*b* to be connected to the ground potential, the IDT 611*b* being arranged nearer to the first ground terminal 37 than the IDT 615, to the first ground terminal 37 through the ground wiring section A.

Accordingly, also in this preferred embodiment, since the first ground line is longer than the second ground line, balancing between out-of-band attenuation characteristics may be controlled by a difference of the lengths of patterns of the ground lines whereby the balancing is improved.

Figure 12:
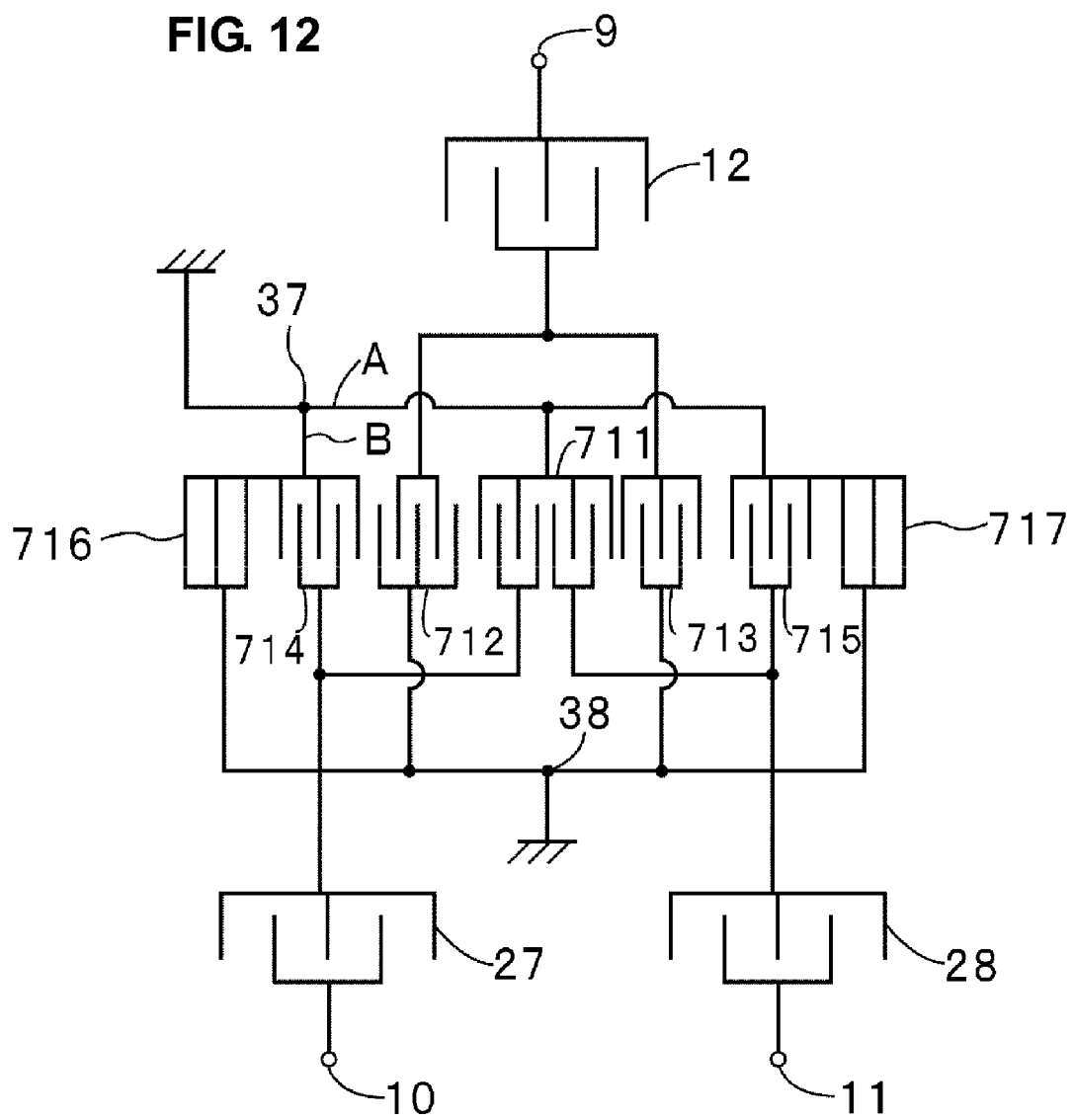
FIG. 12 is a plan view schematically illustrating an electrode configuration of an acoustic wave filter element for a comparison with the acoustic wave filter of the fifth preferred embodiment of the present invention.
Figure 13:
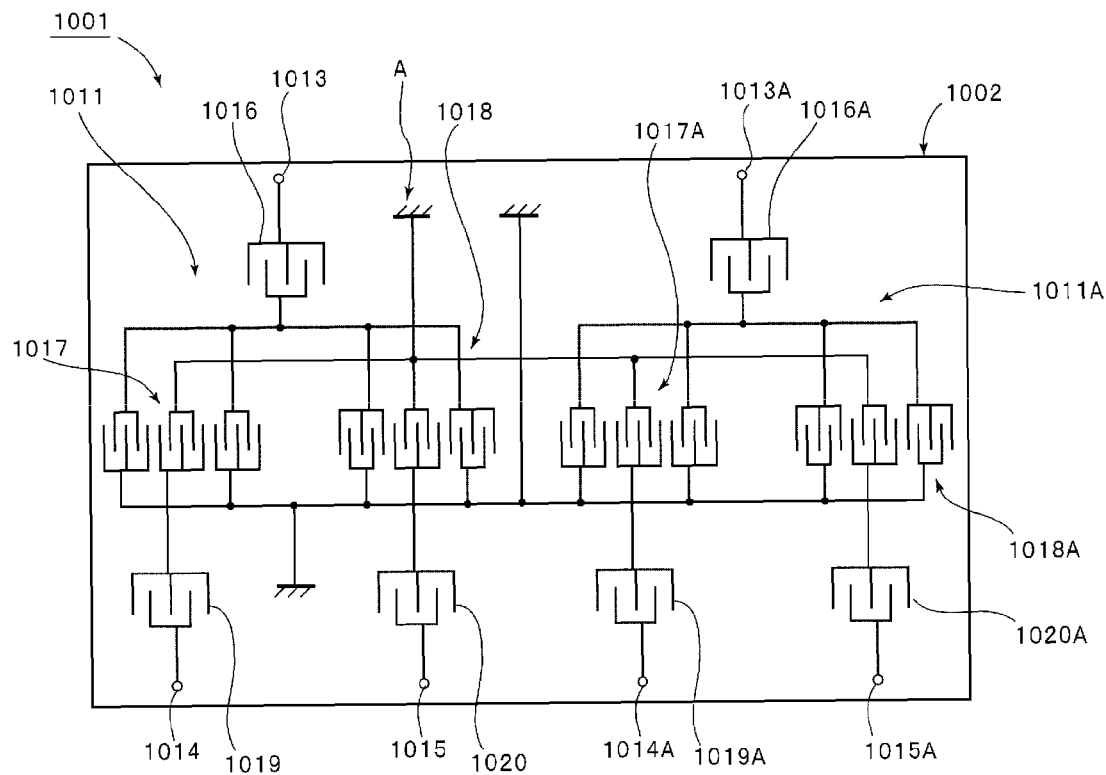
FIG. 13 is a plan view schematically illustrating an example of a conventional acoustic surface wave filter device.

Note that, FIG. 12 is a plan view schematically illustrating an electrode configuration of a conventional acoustic wave filter device for reference corresponding to the acoustic wave filter device of the preferred embodiment shown in FIG. 11. In an acoustic wave filter device 701, one terminal of a fourth IDT 714 to be connected to the ground potential is electrically connected to a ground line unit A through a ground wiring section B.

Accordingly, an out-of-band attenuation characteristic of a first balanced terminal is different from an out-of-band attenuation characteristic of a second balanced terminal, and consequently, balancing between the out-of-band attenuation characteristics may be deteriorated.

Note that in the foregoing preferred embodiments and the modifications, the surface acoustic wave filter elements are preferably used as acoustic wave filter elements. However, instead of a surface acoustic wave, a boundary acoustic wave may be included in this preferred embodiment. That is, the acoustic wave filter devices of this preferred embodiment are preferably configured using boundary acoustic wave filter elements.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A balanced acoustic wave filter device comprising:
an unbalanced terminal;
first and second balanced terminals;
a piezoelectric substrate;
a first longitudinally coupled resonator type acoustic wave filter element arranged on the piezoelectric substrate, which is connected between the unbalanced terminal and the first balanced terminal, and which includes second, first, and third IDTs arranged in this order in an acoustic wave propagation direction and first and second reflectors arranged so as to sandwich a region including the first to third IDTs in the acoustic wave propagation direction; and
a second longitudinally coupled resonator type acoustic wave filter element arranged on the piezoelectric substrate so as to be spaced away from the first acoustic wave filter element in the acoustic wave propagation direction, which is connected between the unbalanced terminal and the second balanced terminal, and which includes fifth, fourth, and sixth IDTs arranged in this order in the acoustic wave propagation direction and third and fourth reflectors arranged so as to sandwich a region including the fourth to sixth IDTs in the acoustic wave propagation direction; wherein
one terminal of the first IDT and one terminal of the fourth IDT are connected to the unbalanced terminal, the other terminal of the first IDT and the other terminal of the fourth IDT are connected to a ground potential, one terminal of the second IDT and one terminal of the third IDT are connected to the first balanced terminal, the other terminal of the second IDT and the other terminal of the third IDT are connected to the ground potential, one terminal of the fifth IDT and one terminal of the sixth IDT are connected to the second balanced terminal, and the other terminal of the fifth IDT and the other terminal of the sixth IDT are connected to the ground potential;
on the piezoelectric substrate, a first ground terminal connected to an external ground potential is arranged nearer to the unbalanced terminal relative to the first and second longitudinally coupled resonator type acoustic wave filter elements and nearer to the first longitudinally coupled resonator type acoustic wave filter element relative to the center between the first and second longitudinally coupled resonator type acoustic wave filter elements; and
a first ground line that is arranged to connect the terminal, which is connected to the ground potential, of one of the second and third IDTs which is arranged nearer to the first ground terminal to the first ground terminal is longer than a second ground line that is arranged to connect the terminal, which is connected to the ground potential, of one of the fifth and sixth IDTs which is arranged nearer to the first ground terminal to the first ground terminal.

2. The balanced acoustic wave filter device according to claim 1, further comprising a second ground terminal which is connected to the terminals of the IDTs connected to the unbalanced terminal, the terminals being to be connected to the ground potential, and which is arranged in a region opposite to a region including the unbalanced terminal relative to the IDTs.

3. A composite filter including the balanced acoustic wave filter device set forth in claim 1.

4. The composite filter according to claim 3, further comprising an acoustic wave filter device different from the balanced acoustic wave filter device, wherein the balanced acoustic wave filter device and the other acoustic wave filter device are arranged on the single piezoelectric substrate, and the first ground terminal is shared by the balanced acoustic wave filter device and the other acoustic wave filter device.

5. A balanced acoustic wave filter device comprising:
an unbalanced terminal;
first and second balanced terminals;
a piezoelectric substrate; and
first to fourth longitudinally coupled resonator type acoustic wave filter elements arranged on the piezoelectric substrate; wherein
phases of signals output in response to signals input to three of the first to fourth longitudinally coupled resonator type acoustic wave filter elements are the same as one another, and are shifted by 180 degrees with respect to a signal output in response to a signal input to the remaining one of the longitudinally coupled resonator type acoustic wave filter elements;
the first longitudinally coupled resonator type acoustic wave filter element includes second, first, and third IDTs arranged in this order in an acoustic wave propagation direction and first and second reflectors arranged so as to sandwich a region including the first to third IDTs in the acoustic wave propagation direction;
the second longitudinally coupled resonator type acoustic wave filter element is arranged on the piezoelectric substrate so as to be spaced away from the first longitudinally coupled resonator type acoustic wave filter element in the acoustic wave propagation direction, and includes fifth, fourth, and sixth IDTs arranged in this order in the acoustic wave propagation direction and third and fourth reflectors arranged so as to sandwich a region including the fourth to sixth IDTs in the acoustic wave propagation direction;
one terminal of the first IDT of the first longitudinally coupled resonator type acoustic wave filter element and one terminal of the fourth IDT of the second longitudinally coupled resonator type acoustic wave filter element are connected to each other and further connected to the unbalanced terminal, the first longitudinally coupled resonator type acoustic wave filter element is connected to the first balanced terminal through the third longitudinally coupled resonator type acoustic wave filter element, and the second longitudinally coupled resonator type acoustic wave filter element is connected to the second balanced terminal through the fourth longitudinally coupled resonator type acoustic wave filter element;
on the piezoelectric substrate, a first ground terminal connected to an external ground potential is arranged nearer to the unbalanced terminal relative to the first and second longitudinally coupled resonator type acoustic wave filter elements and nearer to the first acoustic wave filter element relative to the center between the first and second longitudinally coupled resonator type acoustic wave filter elements; and
a first ground line that is arranged to connect the terminal, which is connected to the ground potential, of one of the second and third IDTs which is arranged nearer to the first ground terminal to the first ground terminal is longer than a second ground line that is arranged to connect the terminal, which is connected to the ground potential, of one of the fifth and sixth IDTs which is arranged nearer to the first ground terminal to the first ground terminal.

6. The balanced acoustic wave filter device according to claim 5, further comprising a second ground terminal which is connected to the terminals of the IDTs connected to the unbalanced terminal, the terminals being to be connected to the ground potential, and which is arranged in a region opposite to a region including the unbalanced terminal relative to the IDTs.

7. A composite filter including the balanced acoustic wave filter device set forth in claim 5.

8. The composite filter according to claim 7, further comprising an acoustic wave filter device different from the balanced acoustic wave filter device, wherein the balanced acoustic wave filter device and the other acoustic wave filter device are arranged on the single piezoelectric substrate, and the first ground terminal is shared by the balanced acoustic wave filter device and the other acoustic wave filter device.

9. A longitudinally coupled resonator type balanced acoustic wave filter device, comprising:
a piezoelectric substrate;
a first IDT arranged on the piezoelectric substrate;
second and third IDTs arranged so as to sandwich the first IDT in an acoustic wave propagation direction, fourth and fifth IDTs arranged so as to sandwich a region including the first to third IDTs in the acoustic wave propagation direction, and first and second reflectors arranged so as to sandwich a region including the first to fifth IDTs in the acoustic wave propagation direction;

an unbalanced terminal and first and second balanced terminals, one terminal of the second IDT and one terminal of the third IDT being connected to the unbalanced terminal; and a first divided IDT section and a second divided IDT section defined by portions of the first IDT divided in the acoustic wave propagation direction; wherein the first divided IDT section and the fourth IDT are connected to the first balanced terminal, and the second divided IDT section and the fifth IDT are connected to the second balanced terminal;

on the piezoelectric substrate, a first ground terminal connected to an external ground potential is arranged nearer to the unbalanced terminal relative to the first to fifth IDTs and nearer to the fourth IDT relative to the center of the first IDT; and a first ground line that is arranged to connect the terminal of the fourth IDT connected to the ground potential to the first ground terminal is longer than a second ground line which connects the second divided IDT section to the first ground terminal.

10. The balanced acoustic wave filter device according to claim 9, further comprising a second ground terminal which is connected to the terminals of the IDTs connected to the unbalanced terminal, the terminals being to be connected to the ground potential, and which is arranged in a region opposite to a region including the unbalanced terminal relative to the IDTs.

11. A composite filter including the balanced acoustic wave filter device set forth in claim 9.

12. The composite filter according to claim 11, further comprising an acoustic wave filter device different from the balanced acoustic wave filter device, wherein the balanced acoustic wave filter device and the other acoustic wave filter device are arranged on the single piezoelectric substrate, and the first ground terminal is shared by the balanced acoustic wave filter device and the other acoustic wave filter device.

13. A balanced acoustic wave filter device comprising:
an unbalanced terminal;
first and second balanced terminals;
a piezoelectric substrate;
a first longitudinally coupled resonator type acoustic wave filter element arranged on the piezoelectric substrate, which is connected between the unbalanced terminal and the first balanced terminal, and which includes fourth, second, first, third, and fifth IDTs arranged in this order in an acoustic wave propagation direction and first and second reflectors arranged so as to sandwich a region including the first to fifth IDTs in the acoustic wave propagation direction; and a second longitudinally coupled resonator type acoustic wave filter element arranged on the piezoelectric substrate so as to be spaced away from the first longitudinally coupled resonator type acoustic wave filter element in the acoustic wave propagation direction which is connected between the unbalanced terminal and the second balanced terminal, and which includes ninth, seventh, sixth, eighth, and tenth IDTs arranged in this order in the acoustic wave propagation direction and third and fourth reflectors arranged so as to sandwich a region including the sixth to tenth IDTs in the acoustic wave propagation direction; wherein one terminal of the second IDT, one terminal of the third IDT, one terminal of the seventh IDT, and one terminal of the eighth IDT are connected to one another and further connected to the unbalanced terminal, the other terminal of the second IDT, the other terminal of the third IDT, the other terminal of the seventh IDT, the other terminal of the eighth IDT are connected to a ground potential, one terminal of the fourth IDT, one terminal of the first IDT, and one terminal of the fifth IDT are connected to the ground potential, the other terminal of the fourth IDT, the other terminal of the first IDT, and the other terminal of the fifth IDT are connected to the first balanced terminal, one terminal of the ninth IDT, one terminal of the sixth IDT, and one terminal of the tenth IDT are connected to the ground potential, and the other terminal of the ninth IDT, the other terminal of the sixth IDT, and the other terminal of the tenth IDT are connected to the second balanced terminal;

on the piezoelectric substrate, a first ground terminal connected to an external ground potential is arranged nearer to the unbalanced terminal relative to the first and second longitudinally coupled resonator type acoustic wave filter elements and nearer to the first longitudinally coupled resonator type acoustic wave filter element relative to the center between the first and second acoustic wave filter elements; and a first ground line that is arranged to connect the terminal of the fourth IDT connected to the ground potential to the first ground terminal is longer than a second ground line that is arranged to connect the terminal of the ninth IDT connected to the ground potential to the first ground terminal.

14. The balanced acoustic wave filter device according to claim 13, further comprising a second ground terminal which is connected to the terminals of the IDTs connected to the unbalanced terminal, the terminals being to be connected to the ground potential, and which is arranged in a region opposite to a region including the unbalanced terminal relative to the IDTs.

15. A composite filter including the balanced acoustic wave filter device set forth in claim 13.

16. The composite filter according to claim 15, further comprising an acoustic wave filter device different from the balanced acoustic wave filter device, wherein the balanced acoustic wave filter device and the other acoustic wave filter device are arranged on the single piezoelectric substrate, and the first ground terminal is shared by the balanced acoustic wave filter device and the other acoustic wave filter device.

* * * * *